United States Patent [19]

McLouski et al.

[11] 4,098,924
[45] Jul. 4, 1978

[54] GATE FABRICATION METHOD FOR MNOS MEMORY DEVICES

[75] Inventors: Raymond M. McLouski, Glen Burnie; Philip R. Reid, Laurel, both of Md.

[73] Assignee: Westinghouse Electric Corp., Pittsburgh, Pa.

[21] Appl. No.: 733,746

[22] Filed: Oct. 19, 1976

[51] Int. Cl.² ........................ B05D 5/12; H01L 29/78
[52] U.S. Cl. .................................. 427/93; 427/248 A; 427/378; 427/314; 357/23
[58] Field of Search ................. 427/93, 248 A, 314, 427/378; 357/23

[56] References Cited
U.S. PATENT DOCUMENTS

| 3,647,535 | 3/1972 | Naber | 427/93 X |
| 3,692,571 | 9/1972 | Colton et al. | 427/93 |
| 3,719,866 | 3/1973 | Naber et al. | 357/54 |

*Primary Examiner*—Ralph S. Kendall
*Attorney, Agent, or Firm*—H. W. Patterson

[57] ABSTRACT

An improved method for growing the silicon oxide memory insulator of an MNOS memory transistor is disclosed. The oxide is grown by passing a mixture of inert gas and anhydrous HCL over the substrate while the temperature is maintained within a predetermined range.

20 Claims, 4 Drawing Figures

4,098,924

GATE FABRICATION METHOD FOR MNOS MEMORY DEVICES

BACKGROUND OF THE INVENTION

1. Field of the Invention

The invention relates to transistors and more specifically to improved methods of growing the memory oxide of MNOS memory transistors.

2. Description of the Prior Art

It is well known in the prior art that the characteristics of MNOS memory transistors are highly dependent on the quality of the memory oxide. Parameters affected by the quality of this oxide include the memory window, memory retention time, and the writing characteristics of the transistors. Prior art methods used to form the memory oxide included the use of residual oxides, low temperature growth in oxygen atmospheres and wet chemical means. It has been obvious to those in the art that none of these methods have yielded optimal results.

SUMMARY OF THE INVENTION

This invention relates to a method for making MNOS transistors which greatly improves the quality of the silicon oxide gate insulator. In the disclosed method the drain and source of one or more transistors are formed in a substrate using conventional processes. Following formation of the drain and source a silicon oxide region greater than 100 Angstroms is formed overlying the entire surface of the substrate. Windows are then etched in the silicon oxide in regions where the thin gate oxide of each of the transistors is to be formed. The thin silicon oxide portion of the gate insulator is then grown by placing the substrate in a furnace and selectively passing anhydrous HCL and an inert gas, preferably nitrogen, over the surface of the substrate while the temperature of the furnace is maintained at a predetermined value. After the gate oxide is grown utilizing this method, the substrate may be conventionally processed to complete the transistor. Utilizing this method has been found to significantly improve the DC memory window, the memory retention time and the writing characteristics of the transistor.

The method is also useful for growing oxide layers for any semiconductor device utilizing charge tunnelling to store charges in an insulating structure.

DESCRIPTION OF THE PREFERRED EMBODIMENT

Figure 1:
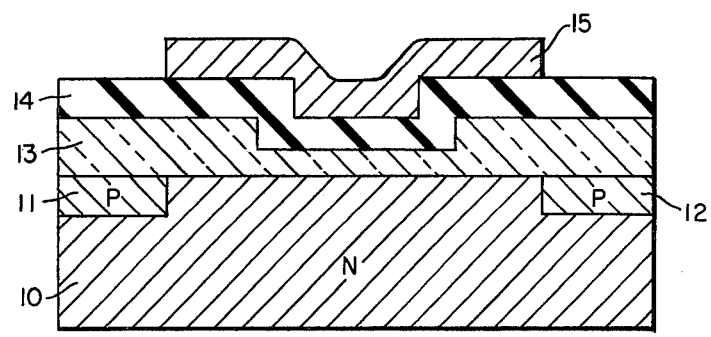
FIG. 1 is a cross-sectional view of a typical MNOS transistor.

FIG. 1 is a cross-sectional view of a typical MNOS memory transistor. The transistor includes an N conductivity type silicon substrate 10. P conductivity type regions 11 and 12 respectively serve as the source and drain of the transistor. Overlying the upper surface of the substrate is a first insulating layer 13 preferably of silicon oxide which includes a thick non-memory portion and a thin memory portion. Overlying the silicon oxide layer 13 is a second insulating layer 14 preferably of silicon nitride. An electrically conductive layer 15 forms the gate of the transistor. Electrical contact to the drain and source regions 11 and 12 can be made by any convenient means. The operation of the device illustrated in FIG. 1 is more fully described in Patent Application Ser. No. 219,463 which is assigned to the same assignee as this application.

The transistor illustrated in FIG. 1 is a typical prior art MNOS memory transistor. The process disclosed herein can be utilized to construct individual transistors or a plurality of transistors of this type on a common substrate. Transistors on a common substrate can be interconnected using known techniques to form memory arrays, integrated circuits and other systems.

Figure 2:
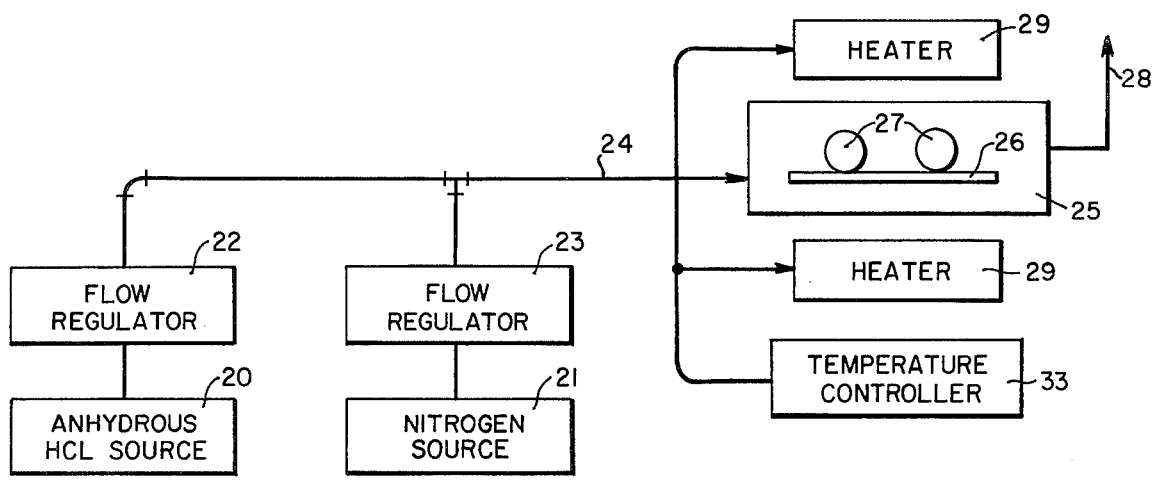
FIG. 2 is a schematic diagram of the furnace apparatus utilized in practicing the method of this invention.

FIG. 2 is a schematic diagram of the furnace apparatus used in practicing the disclosed method for growing the thin memory portion of silicon oxide layer 13. The disclosed method utilizes high purity anhydrous HCL and an inert gas, nitrogen for example, to grow silicon oxide on the N conductivity type silicon substrate. Sources for these gases are illustrated at reference numerals 20 and 21 and may be conventional gas bottles. These two gas sources are respectively connected to flow regulators 22 and 23. These regulators control the flow rate of the anhydrous HCL and nitrogen at the desired value. The output of the flow regulators 22 and 23 feed into a common mixing pipe 24. The flow regulators can be adjusted to maintain a nitrogen atmosphere or a selected mixture of anhydrous HCL and nitrogen in the furnace tube 25. A suitable substrate holder 26 supports typical substrates 27 such that the nitrogen or the mixture of anhydrous HCL and $N_2$ flows evenly over the surface of the substrates 27. The gas or mixture of gases flowing through the furnace tube 25 is exhausted through an exhaust port 28. The temperature inside the furnace tube 25 is maintained at the selected value by a heater 29 in response to a temperature controller 33.

Figure 3:
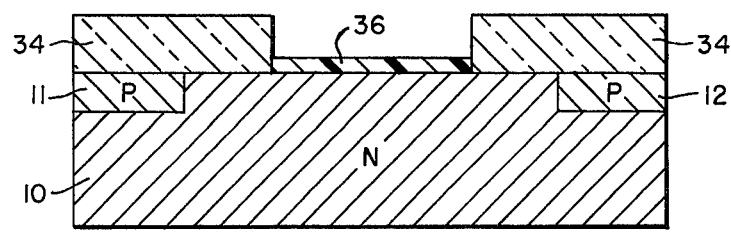
FIG. 3 is a cross-section of an incomplete MNOS transistor prior to being subjected to the method of the present invention illustrating the drain, source and the thick portions of the silicon oxide gate insulator.
Figure 4:
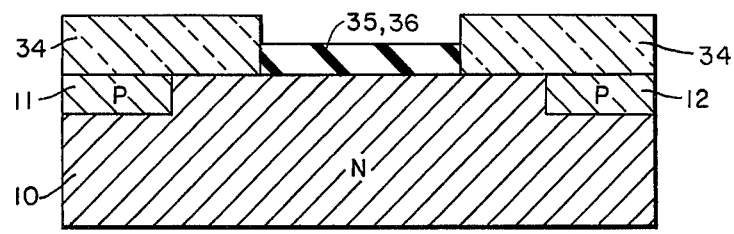
FIG. 4 is a cross-section of an incomplete MNOS transistor illustrating the drain, source, and the thick and thin portions of the silicon oxide gate insulator after being subjected to the method of the present invention.

FIG. 3 illustrates a semiconductor substrate 10 which includes drain and source regions 11 and 12, and thick silicon oxide regions 34 thereon. This structure also includes a thin oxide region 36. This substrate including the drain region, the source region and the oxide layers can be formed using conventional processes. The thin oxide region may be the residual oxide which is not removed when the thick oxide is etched. This layer is typically in the range of 8 to 10 Angstroms.

In practicing the disclosed process, the temperature of the furnace tube is adjusted and maintained at the preferred temperature of 750° C. The source of inert gas, (preferably nitrogen) 21 is turned on and flow regulator 23 is adjusted to give a flow rate of approximately 1 liter per minute through the furnace tube 25. Substrates 27, which include partially constructed transistors, as illustrated in FIG. 3, are placed in the furnace while the nitrogen flow of 1 liter per minute is maintained for five minutes. The source of anhydrous HCL is then turned on and flow regulator 22 is adjusted to produce a gas mixture in the furnace tube 25 comprising approximately 1.0% HCL and 99% nitrogen. The preferred temperature of 750° C and the flow rate of the gaseous mixture of approximately 1 liter per minute are maintained for approximately 10 minutes to grow from the thin oxide portion of oxide layer 36, an insulating layer resulting in an insulating layer 35 which is in the range of 20 to 35 Angstroms thick.

After the thin oxide layer has been grown, the anhydrous HCL source 20 is turned off and the nitrogen flow is maintained at approximately 1 liter per minute for approximately 1 minute. Substrates 27 are then removed from the furnace and allowed to cool in ambient atmosphere. This results in a memory insulator layer 35 having superior characteristics. The exact chemical composition of this layer is not completely known although it is believed to be primarily silicon oxide combined with chlorine.

In practicing the invention the furnace utilized had a tube 25 of approximately 2.5 inches in diameter and 64.0 inches long. The heaters 29 as well as the flow regulators 22 and 23 and the mixing pipe 24 may be of any conventional design. However, the detailed design of the furnace may affect the flow patterns of the gases within the furnace and have some effect on the preferred temperature and flow rates. But it has been found that a temperature and concentration of HCL can be found which optimizes the memory characteristics of the transistor and that the temperature will be between 600° and 900° C with the gas concentrations varying from approximately 1% HCL and 99% nitrogen to 0.1% HCL and 99.9% nitrogen.

In actual test MNOS transistors constructed using this process have been found to have a DC memory window of 12.0 volts and a memory decay rate of 0.35 to 0.1 volts per decade. Prior art residual oxide techniques for growing the thin oxide result in a memory window of 9.5 volts and an average memory decay rate of 0.5 volts per decade.

We claim:

1. A method of growing an insulating layer from a thin oxide layer formed on a silicon substrate to improve the memory window and reduce the rate of memory decay of a device in which said layer and substrate is utilized, comprising the steps of:
   heating the substrate on which the layer is formed in a furnace chamber of approximately 600° to 900° centigrade through which a substantially pure inert gas is flowing at a selected rate;
   introducing anhydrous HCL into the furnace at a selected rate to subject the heated oxide layer to a predetermined percentage mixture of the inert gas and the anhydrous HCL;
   eliminating the anhydrous HCL from the mixture upon the expiration of a selected period of time; and
   permitting the substrate to cool.

2. A method according to claim 1 wherein the furnace has a temperature of approximately 750° centigrade.

3. A method according to claim 1 wherein the predetermined mixture of the inert gas and the anhydrous HCL is in the ratio of approximately 99% of the inert gas and 1% anhydrous HCL.

4. A method according to claim 1 wherein the inert gas is nitrogen.

5. A method according to claim 1 wherein the substrate is subjected to the mixture of anhydrous HCL and the inert gas for approximately 10 minutes for a flow rate of 1 liter per minute.

6. A method according to claim 1 wherein the substrate is subjected to the inert gas flow prior to the introduction of the anhydrous HCL for approximately 5 minutes for a flow rate of 1 liter per minute.

7. A method according to claim 1 wherein the substrate is subjected to the inert gas subsequent to the elimination of the anhydrous HCL for a period of approximately 1 minute for a flow rate of approximately 1 liter per minute.

8. A method according to claim 1 wherein the cooling step is performed by cooling the substrate to ambient temperature subsequent to removal from the furnace.

9. A method according to claim 1 wherein the said insulating layer is a gate oxide layer.

10. A method according to claim 1 wherein the said insulating layer is a memory oxide layer of an MNOS device which utilizes tunnelling to store charges.

11. A method of processing a thin oxide portion of an MNOS memory transistor to provide a device having a DC memory window of approximately 12 volts and a memory decay rate of approximately 0.35 to 0.1 volts per decade, comprising the steps of:
    subjecting the MNOS substrate having previously formed drain and source regions and an overlying thick and thin oxide portion to a furnace temperature of approximately between 600° to 900° centigrade in an atmosphere of a flowing inert gas;
    changing the inert gas atmosphere to a flowing atmosphere of approximately 1% anhydrous HCL and 99% inert gas after a first predetermined time interval;
    changing the anhydrous HCL and inert gas atmosphere to an inert gas atmosphere after a second predetermined time interval; and
    cooling the substrate after a third predetermined time interval.

12. A method according to claim 11 wherein the furnace has a temperature of approximately 750° centigrade.

13. A method according to claim 12 wherein the thin portion of the oxide layer is formed by etching a portion of the thick oxide layer, said thin portion being the residual oxide layer after etching.

14. A method according to claim 11 wherein the inert gas is nitrogen.

15. A method according to claim 11 wherein the second predetermined time interval is approximately 10 minutes.

16. A method according to claim 11 wherein the first predetermined time interval is approximately 5 minutes.

17. A method according to claim 11 wherein the third predetermined time interval is approximately 1 minute.

18. A method according to claim 11 wherein the cooling step is carried out in an ambient atmosphere 19. A method according to claim 11 wherein the thick portion of the oxide layer is greater than one hundred Angstroms and the thin portion of the oxide layer prior to the first named step is in the neighborhood of eight to ten Angstroms.

20. A method of processing a thin oxide layer formed on a silicon substrate, comprising the steps of:
    subjecting the substrate on which the layer is formed to a furnace chamber having a temperature between approximately 600° and 900° centigrade through which an inert gas is flowing for approximately 5 minutes for a rate of approximately 1 liter per minute for a chamber of approximately ten square inches in cross section;
    introducing anhydrous HCL into the heated chamber for approximately ten minutes for a mixture of 99% inert gas and 1% HCL for an approximate rate of one liter per minute;
    continuing the flow of inert gas in the furnace chamber for approximately 1 minute for a flow rate of approximately 1 liter per minute; and
    removing the substrate from the furnace.

* * * * *